US011645296B1

(12) United States Patent
Bentley et al.

(10) Patent No.: US 11,645,296 B1
(45) Date of Patent: May 9, 2023

(54) TECHNIQUES FOR DECOUPLING ACCESS TO INFRASTRUCTURE MODELS

(71) Applicant: Bentley Systems, Incorporated, Exton, PA (US)

(72) Inventors: Keith A. Bentley, Elverson, PA (US); Samuel W. Wilson, Downingtown, PA (US); Shaun C. Sewall, Glenmoore, PA (US)

(73) Assignee: Bentley Systems, Incorporated, Exton, PA (US)

( * ) Notice: Subject to any disclaimer, the term of this patent is extended or adjusted under 35 U.S.C. 154(b) by 259 days.

(21) Appl. No.: 16/559,057

(22) Filed: Sep. 3, 2019

Related U.S. Application Data

(60) Provisional application No. 62/745,104, filed on Oct. 12, 2018.

(51) Int. Cl.
*G06F 16/25* (2019.01)
*H04L 67/02* (2022.01)
(Continued)

(52) U.S. Cl.
CPC .......... *G06F 16/252* (2019.01); *G06F 16/212* (2019.01); *G06F 16/2428* (2019.01); *H04L 67/02* (2013.01)

(58) Field of Classification Search
CPC .. G06F 16/252; G06F 16/2428; G06F 16/212; H04L 67/02
(Continued)

(56) References Cited

U.S. PATENT DOCUMENTS 6,341,291 B1   1/2002 Bentley et al.
8,706,692 B1 * 4/2014 Luthra ............... G06F 16/27
                                                    707/622
(Continued)

OTHER PUBLICATIONS

U.S. Appl. No. 16/156,824, filed Oct. 10, 2018 by Ramanujam Raman et al. for Technique for Generating a Change Cache Database Utilized to Inspect Changes Made to a Repository, pp. 1-35.
(Continued)

*Primary Examiner* — Hares Jami
(74) *Attorney, Agent, or Firm* — Cesari and McKenna, LLP; James A. Blanchette

(57) ABSTRACT

In example embodiments, techniques are provided for decoupling user access to infrastructure models from proprietary software that maintains and updates the infrastructure models. A backend application may include an infrastructure modeling backend module that, among other functions, handles communication with an infrastructure modeling frontend module of a frontend application that provides user access to the infrastructure model, infrastructure modeling hub services that maintain repositories for the infrastructure model, and an infrastructure modeling native module that creates, performs operations upon, and updates local instances of a database that stores the infrastructure model. While the infrastructure modeling backend module may pass information obtained from the infrastructure modeling frontend module and infrastructure modeling hub services to the infrastructure modeling native module, it may be functionally separated from the software of the infrastructure modeling native module that understands how to maintain and update infrastructure models, including interacting with local instances of the database.

8 Claims, 6 Drawing Sheets

(51) Int. Cl.
    *G06F 16/242*     (2019.01)
    *G06F 16/21*     (2019.01)

(58) Field of Classification Search
    USPC ........................................................ 707/722
    See application file for complete search history.

(56) References Cited

U.S. PATENT DOCUMENTS

| | | | |
|---|---|---|---|
| 8,719,229 B1 | 5/2014 | Awe et al. | |
| 9,053,080 B2 | 6/2015 | Look et al. | |
| 10,311,170 B2 | 6/2019 | Heidinger et al. | |
| 2007/0021955 A1 | 1/2007 | Tolone et al. | |
| 2007/0299937 A1* | 12/2007 | Winter | H04L 67/1095 |
| | | | 709/219 |
| 2011/0113359 A1* | 5/2011 | Massey | G06F 8/71 |
| | | | 715/771 |
| 2011/0126275 A1* | 5/2011 | Anderson | H04L 63/08 |
| | | | 726/8 |
| 2011/0264678 A1* | 10/2011 | Mital | G06F 16/9535 |
| | | | 707/769 |
| 2012/0096070 A1* | 4/2012 | Bryzak | H04L 67/02 |
| | | | 709/203 |
| 2014/0013099 A1 | 1/2014 | Sekiguchi et al. | |
| 2014/0358860 A1* | 12/2014 | Wautier | G06F 16/27 |
| | | | 707/638 |
| 2015/0286558 A1 | 10/2015 | Bartlow et al. | |
| 2017/0220606 A1 | 8/2017 | Wang et al. | |
| 2017/0277761 A1* | 9/2017 | Bentley | G06F 16/288 |
| 2018/0144016 A1 | 5/2018 | Bestfleisch et al. | |
| 2019/0004925 A1 | 1/2019 | Buckingham et al. | |
| 2019/0079958 A1 | 3/2019 | Bentley et al. | |
| 2019/0081847 A1 | 3/2019 | Bentley et al. | |
| 2019/0108245 A1 | 4/2019 | Bentley et al. | |
| 2019/0354540 A1 | 11/2019 | Stigsen | |

OTHER PUBLICATIONS

"Notification of Transmittal of the International Search Report and the Written Opinion of the International Searching Authority, or the Declaration," International Filing Date: Oct. 1, 2019, International Application No. PCT/US2019/054017, Applicant: Bentley Systems, Incorporated, dated Jan. 27, 2020, pp. 1-13.

Scott, Tamara, "How to Use an API: Just the Basics," Retrieved from the Internet: <https://technologyadvice.com/blog/information-technology/how-to-use-an-api/>, Dec. 19, 2016, pp. 1-11.

* cited by examiner

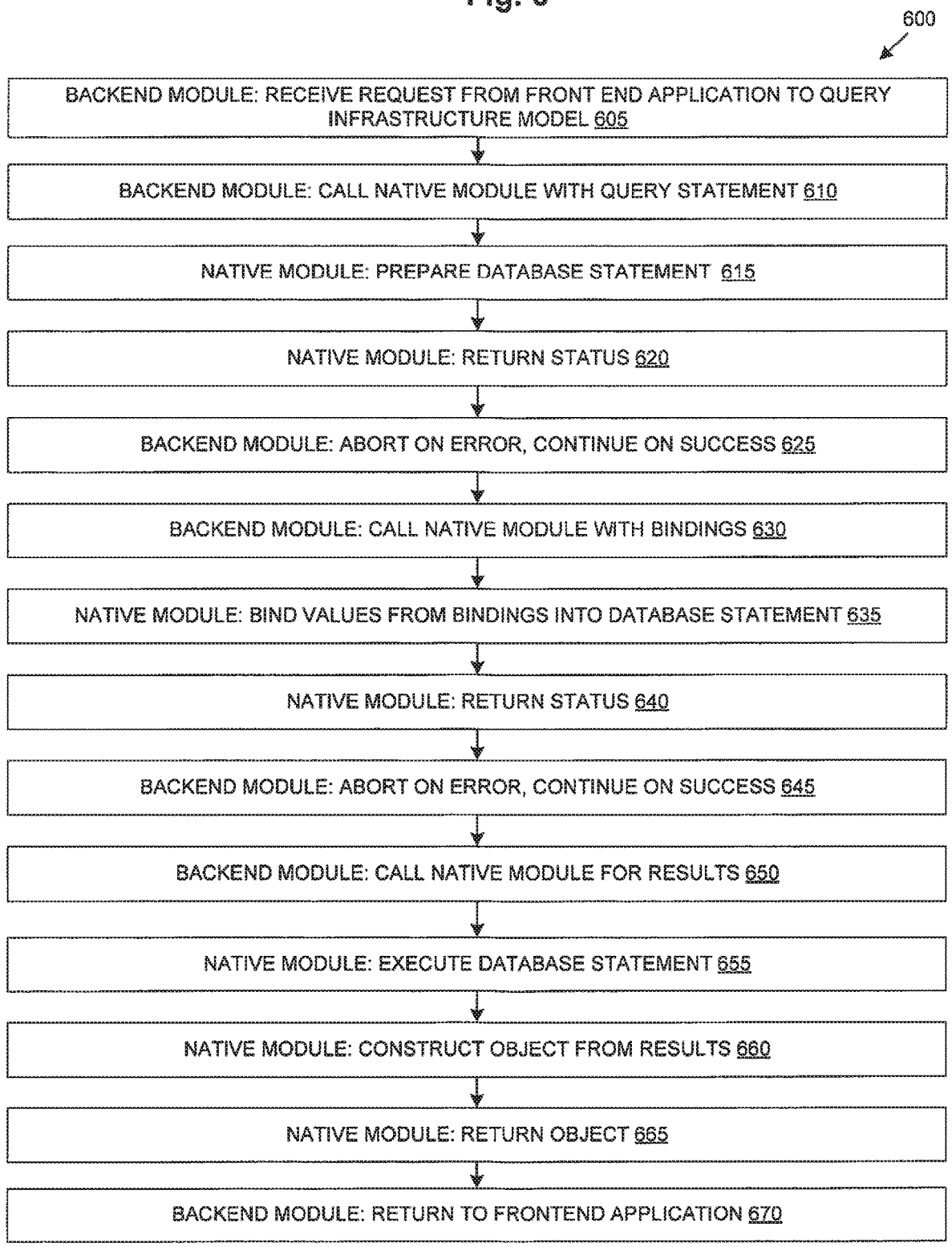

TECHNIQUES FOR DECOUPLING ACCESS TO INFRASTRUCTURE MODELS

RELATED APPLICATIONS

Priority is claimed to previously filed U.S. Provisional Patent Application No. 62/745,104 filed on Oct. 12, 2018 for TECHNIQUES FOR DECOUPLING ACCESS TO INFRASTRUCTURE MODELS, the contents of which are incorporated herein by reference in their entirety.

BACKGROUND

Technical Field

The present disclosure relates generally to infrastructure modeling, and more specifically to software architectures for permitting distributed user access to infrastructure models.

Background Information

Throughout the design, construction and operation of infrastructure (e.g., buildings, factories, roads, railways, bridges, electrical and communication networks, etc.) it is often desirable to model the infrastructure using infrastructure modeling applications. Infrastructure modeling applications traditionally have used a variety of different technologies and data formats to maintain infrastructure descriptions for is different phases of the project. In the past, infrastructure information maintained according to such formats have been disjointed, and have included substantial data redundancies, inconsistencies, and other sources of inefficiency. Models may have been optimized and adapted for particular use cases, generally without regard for other phases of the infrastructure project, leading to distinct product/discipline/phase data silos and disconnected workflows.

More recently, systems have been developed that can break down such existing product/disciple/phase data silos and enable the generation of a true "digital twin" of real-world infrastructure that describes the aspects of infrastructure in a more unified manner. Generation of this sort of "digital twin" has addressed many of the limitations of traditional infrastructure modeling techniques. However, it has also led to new technical challenges. These challenges include issues of how to enable distributed user access to infrastructure models from multiple different sources, while providing high performance (e.g., in terms of network bandwidth, processing load, etc.) and ensuring security. Accordingly, there is a need for improved techniques for permitting distributed user access to infrastructure models, while addressing these issues.

SUMMARY

In example embodiments, techniques are provided for decoupling user access to infrastructure models from proprietary software that maintains and updates the infrastructure models. A backend application may include an infrastructure modeling backend module that, among other functions, handles communication with an infrastructure modeling frontend module of a frontend application that provides user access to the infrastructure model, infrastructure modeling hub services that maintain repositories for the infrastructure model, and an infrastructure modeling native module that creates, performs operations upon (e.g., inserting, deleting and querying models, elements, properties, etc.), and updates (e.g., applies changesets to) local instances of a database that stores the infrastructure model. While the infrastructure modeling backend module may pass information obtained from the infrastructure modeling frontend module and infrastructure modeling hub services to the infrastructure modeling native module, it may be functionally separated from the software of the infrastructure modeling native module that understands how to maintain and update infrastructure models, including interacting with local instances of the database. Such an arrangement may allow for the development of a variety of customized backend applications whose deployment may reduce network bandwidth consumption, provide load (e.g., processing load) balancing, and other benefits, while increasing security by functionally separating the software that maintains and updates the infrastructure models from the rest of the software of the backend applications.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which:

FIG. 6 is a flow diagram of an example sequence of steps for querying an infrastructure model.

DETAILED DESCRIPTION

Definitions

Figure 1:
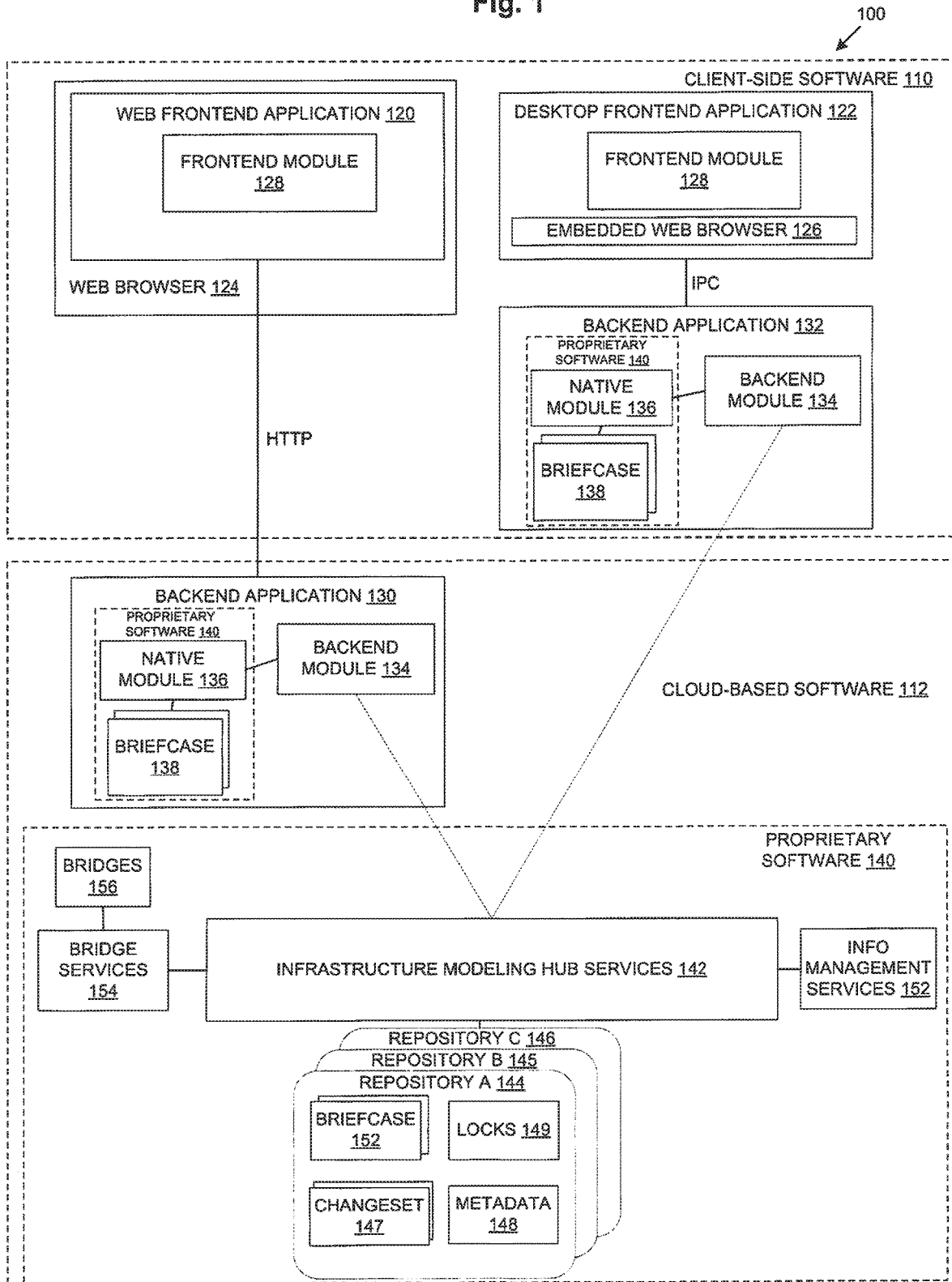
FIG. 1 is a high-level block diagram of an example infrastructure modeling software architecture that decouples user access to infrastructure models from proprietary software that maintains and updates the infrastructure models.

As used herein, the term "infrastructure" refers to a physical structure or object that has been built, or is planned to be built, in the real-world. Examples of infrastructure include buildings, factories, roads, railways, bridges, electrical and communication networks, etc.

As used herein, the terms "built infrastructure schema" or "BIS" refer to a type of conceptual schema (i.e. a conceptual data model) that describes the semantics of data representing infrastructure.

As used herein, the term "infrastructure model" refers to a digital representation of infrastructure. An infrastructure model may be organized according to a built infrastructure schema. One specific type of infrastructure model may be the iModel® infrastructure model.

As used herein, the term "infrastructure modeling repository", or simply "repository", refers to a distributed database that stores one or more infrastructure models. Each materialized view of such a distributed database may be referred to as a "briefcase," as discussed below.

As used herein, the term "changeset" refers to a persistent electronic record that captures changes needed to transform a particular instance of a database from one version to a new version. As explained below, in example implementations, an ordered series of changesets may represent a timeline. Changesets of a timeline may capture the changes needed to move an instance of a database from one version (a version M) to another version (a version Q). The changesets may be applied in sequential order to move version M to version Q. The changesets may also be applied in reverse sequential order to move version Q back to version M.

As used herein, the term "briefcase" refers to a particular instance of a database. In example implementations, the briefcase may represent a materialized view of the information of a specific version of the repository. A version of a briefcase (a version M) may be considered the information resulting from sequentially applying all changesets up to and including changeset M to a "baseline" briefcase, for example, an empty "baseline" briefcase. A briefcase of version M can be moved to another version (a version Q) by applying to it the set of changesets from N to Q, inclusive.

As used herein, the term "element" refers to a record maintained in a briefcase. An element represents (i.e. "models", in a colloquial sense of the term) an entity in the real-world. In example implementations, the entity in the real-world may be an individual unit of infrastructure.

As used herein, the term "model" refers to a container for a set of elements where the set of elements collectively represent (i.e. "model", in a colloquial sense of the term) an entity in the real-world. In example implementations, the entity in the real-world may be an individual unit of infrastructure. In some cases, models may nest. That is, a model is said to "break down" a particular element into a finer-grained description (i.e. a description that describes the same entity in the real-world but at a fine granularity).

As used herein, the term "relationship" refers to a connection that relates two or more elements or models. Examples of relationships include parent-child relationships that may imply ownership and peer-peer relationships that may define groups.

Example Embodiments

FIG. 1 is a high-level block diagram of an example infrastructure modeling software architecture 100 that decouples user access to infrastructure models (e.g. iModel® infrastructure models). from proprietary software 140 that maintains and updates the infrastructure models. The architecture may be divided into client-side software 110 that executes on one or more computing devices provided local to an end-user (collectively "client devices") and cloud-based software 112 that is executed on one or more computing devices provided remote from the end-user (collectively "cloud computing devices"), accessible via a network (e.g., the Internet). The client-side software 110 may include web frontend applications 120 that operate within a virtual environment (e.g., a "browser sandbox") provided by a web browser 124 (e.g., the Chrome® web browser), and desktop front-end applications 122 that operate directly under an operating system and backend applications 132 that interact therewith. The cloud-based software 112 may include infrastructure modeling hub services (e.g., iModelHub™ services) 142 and backend applications 130 that interact with the web front-end applications 120. At least the infrastructure modeling hub services 142 and portions of the backend applications 132 that operate to maintain and update the infrastructure models may be considered proprietary software 140.

The core of the cloud-based software 112 may be infrastructure modeling hub services 142 that manage repositories 144-146 that include briefcases that store infrastructure models. A briefcase 152 in a repository 144-146 may begin as an empty "baseline" briefcase that is programmatically generated and persisted by infrastructure modeling hub services 142. A repository 144-146 may be modified by accepting new changesets into the sets of accepted changesets 147. As the number of changesets in the sets of accepted changesets 147 grows, the time required to take an empty "baseline" briefcase and apply all changesets needed to transform it into a briefcase at a specific version (e.g., the "most recent version") may grow large. For this reason, infrastructure modeling hub services 142 may create additional "snapshot" briefcases 152 at different versions. When a specific version (e.g., the "most recent version") of a briefcase is needed, the briefcase 152 closest to such version (which may be a "snapshot" briefcase) is accessed and changesets (or reverse changesets) from the set 147 are applied until a briefcase of the needed version is obtained.

The infrastructure model maintained in the briefcases 152 of the repositories 144-146 may be defined utilizing a conceptual schema (e.g., BIS) and stored using an underlying database schema (e.g., a SQlite schema). The conceptual schema may describe infrastructure using digital objects that include elements, models, and relationships, which serve as building blocks of an infrastructure model. Elements represent (i.e. "model", in a colloquial sense of the term) entities in the real-world. One element may be the "lead" element, based on the nature of the entity being modeled. Other elements typically relate back the lead element. A model acts as a container for a set of elements where the set of elements collectively represent (i.e. "model", in a colloquial sense of the term) an entity in the real-world. In some cases, models may nest. That is, a model is said to "break down" a particular element into a finer-grained description. Models may be arranged according to a model hierarchy to support modeling from multiple perspectives. A single repository model may serve as a root of the model hierarchy. Relationships relate two or more elements or models. Examples of relationships include parent-child relationships that may imply ownership and peer-peer relationships that may define groups.

The underlying database schema may describe how the objects are stored to individual rows of tables of the underlying databases. Objects may be maintained using multiple rows of multiple different tables, which store their properties. For example, properties of an element may be spread across multiple rows of multiple tables. To create, remove or modify an object, primitive database operations such as inserts, deletes or updates are performed upon the appropriate rows of the appropriate tables.

The infrastructure modeling hub services 142 may be called by a number of other services in the cloud that perform information management and other functions. For example, information management services 152 may manage asset data, project data, reality data, Internet of Things (IoT) data, codes, and other features. Further, bridge services 154 permit interoperation with legacy data source (not show), incrementally align data using source-format-specific bridges 156 that know how to read and interpret source data of legacy formats. A wide variety of additional services (not shown) may also be provided and call or otherwise interact with infrastructure modeling hub services 142.

In order to permit access to the infrastructure models maintained in the briefcases 152 and changesets 147 of the repositories 144-146, backend applications 130, 132 may be provided. As mentioned above, some backend applications 130 may be located in the cloud as part of cloud-based software 112, while others may be located on a client device as part of client-side software 110. The backend applications 130, 132 may maintain local briefcases 138 and changesets needed to transform them into a desired version. Each backend application 130, 132 may include functionality for interacting with and servicing requests from frontend applications 120, 122, calling infrastructure modeling hub services 142, and creating and performing operations upon (e.g., inserting, deleting and querying models, elements, and properties of, applying changesets to, etc.) local briefcases 138. Such functionality may be implemented by an infrastructure modeling backend module (e.g., iModel.js Backend module) 134 (e.g., written in JavaScript or another language) and an infrastructure modeling native module (e.g., an iModel.js Native module) 136 (e.g., written in C++ or another language). The infrastructure modeling backend module 134 may handle functionality related to interacting with and servicing requests from frontend applications 120, 122, and calling infrastructure modeling hub services 142, but not understand how to create and perform operations upon (e.g., inserting, deleting and querying models, elements, and properties of, applying changesets to, etc.) local briefcases 138 that store the infrastructure model. The infrastructure modeling native module may be relied upon to handle this functionality.

The frontend applications 120, 122 may be concerned mainly with providing a user interface and enabling user interaction with an infrastructure model. As mentioned above, some frontend applications may be web frontend applications 120 that operate within a virtual environment (e.g., a "browser sandbox") provided by a web browser (e.g., the Chrome® web browser) 124 on a client device, while other frontend applications may be desktop front-end applications 122 that execute as stand-alone applications, interacting directly with an operating system of a client device. Desktop front-end applications 122 may include embedded web browser code (e.g., Chromium® embedded web browser code) 126 to permit them to interact with backend applications 132 in a similar manner as web front-end applications 120. Frontend applications 120, 122 may utilize an infrastructure modeling frontend module (e.g., iModel.js Frontend module) 128 (e.g., written in JavaScript or another language) to send requests to an infrastructure modeling backend module (e.g., iModel.js Backend module) 134 and process responses therefrom. Depending upon whether the frontend application 120, 122 is a web frontend application 120 or desktop front-end application 122, the requests and responses may be sent differently. In the case of a web frontend application 120, communication may be via a web protocol (e.g., HyperText Transfer Protocol (HTTP)) to an infrastructure modeling backend module (e.g., a iModel.js Backend module) 134 of a backend application 130 located in the cloud as part of cloud-based software 112. In the case of a desktop frontend application 122, communication may be via inter-process communication (IPC) to an infrastructure modeling backend module (e.g., iModel.js Backend module) 134 of a backend application 132 that is local on the client device as part of client-side software 110.

In operation, the infrastructure modeling software architecture 100 functions to decouple user access to infrastructure models from the proprietary software 140 that maintains and updates the infrastructure models. In particular, while the infrastructure modeling backend module (e.g., iModel.js Backend module) 134 may pass information obtained from the infrastructure modeling frontend module (e.g., iModel.js Frontend module) 128 and infrastructure modeling hub services 142 to the infrastructure modeling native module that is used in creating and performing primitive operations (e.g., inserting, deleting and querying models, elements, and properties of, applying changesets to, etc.) upon briefcases, the infrastructure modeling backend module itself may not understand how to maintain and interact with the briefcases, being functionally isolated therefrom. Such an arrangement may allow for the development of a variety of customized backend applications 130, 132 whose deployment may reduce network bandwidth consumption, provide load balancing, and other benefits, while increasing security by functionally separating the software that understands how to interact with briefcases from the rest of backend applications.

Figure 2:
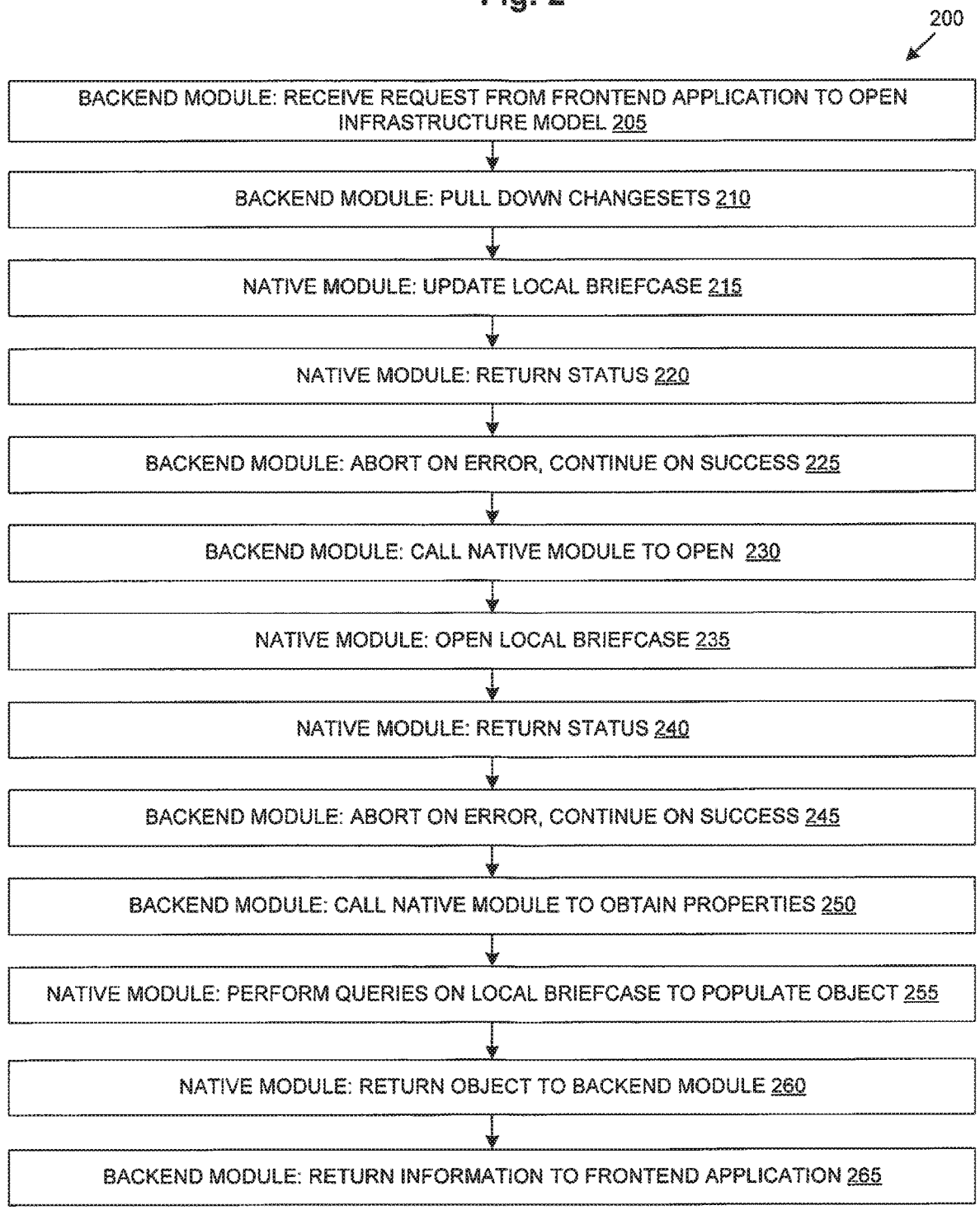
FIG. 2 is a flow diagram of an example sequence of steps for opening an infrastructure model.

FIG. 2 is a flow diagram of an example sequence of steps 200 for opening an infrastructure model. Such operations may be used to obtain a materialized view of a infrastructure model from a repository 144-146 to be stored in a briefcase 138. At step 205, the infrastructure modeling backend module (e.g., iModel.js Backend module) 134 of a backend application 130, 132 receives a request to open an infrastructure model via an infrastructure modeling frontend module (e.g., iModel.js Frontend module) 128 of a frontend application 120, 122. In response, at step 210, the infrastructure modeling backend module 134 pulls down any relevant changesets 147 from infrastructure modeling hub services 142 and provides them to the infrastructure modeling native module 136. At step 215, infrastructure modeling native module 136 applies the changesets to a baseline briefcase (e.g., an empty briefcase or a snapshot briefcase) database to produce a local briefcase 138. At step 220, it returns a status to the infrastructure modeling backend module 134. At step 225, the infrastructure modeling backend module 134 may abort on an error status or continue on a success status. At step 230, the infrastructure modeling backend module 134 calls the infrastructure modeling native module 136 to open the local briefcase 138. At step 235, the infrastructure modeling native module 136 opens the local briefcase 138, and, at step 240, returns a status to the infrastructure modeling backend module 134. At step 245, the infrastructure modeling backend module 134 may abort on an error status or continue on a success status. At step 250, the infrastructure modeling backend module 134 calls the infrastructure modeling native module 136 to obtain properties. At step 255, the infrastructure modeling native module 136 performs queries on the local briefcase 138 to populate an object (e.g., a JavaScript Object Notation (JSON) object or another type of object) with property values, and, at step 260, returns the object to the infrastructure modeling backend module 134. Thereafter, at step 265, the infrastructure modeling backend module 134 returns information from the object to the frontend applications 120, 122.

Figure 3:
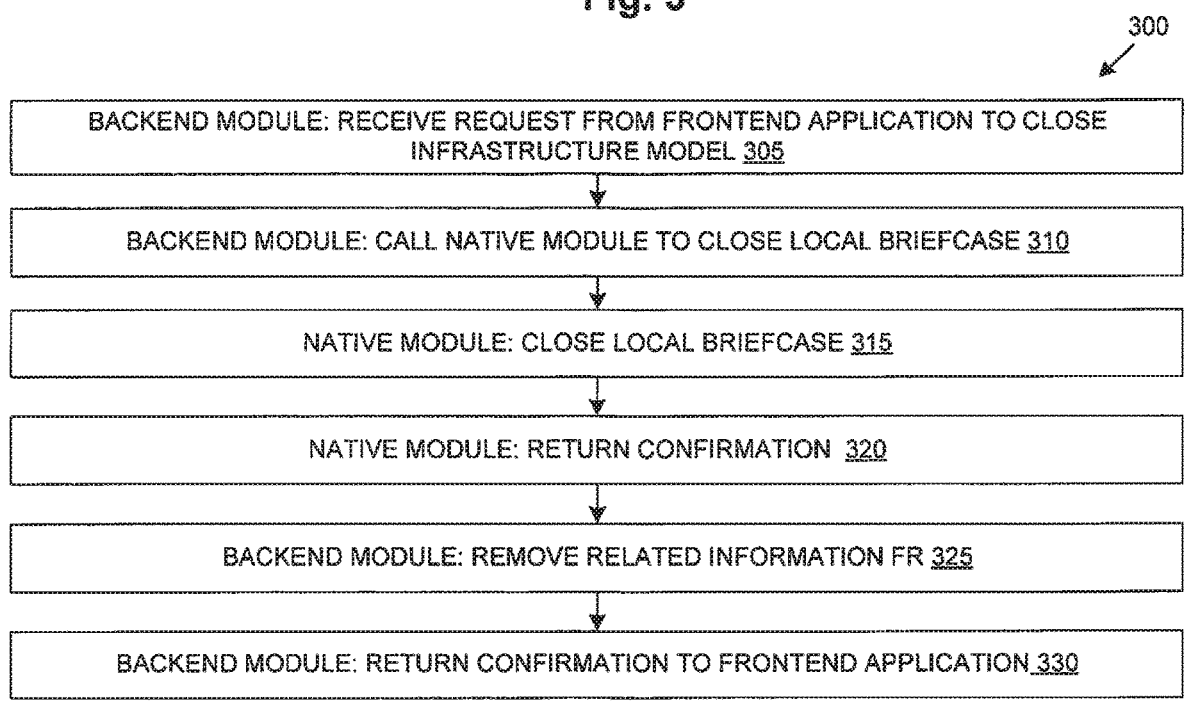
FIG. 3 is a flow diagram of an example sequence of steps for closing an infrastructure model.

FIG. 3 is a flow diagram of an example sequence of steps 300 for closing an infrastructure model. Such operations may be used to close a local briefcase 138. At step 305, the infrastructure modeling backend module (e.g., iModel.js Backend module) 134 of a backend application 130, 132 receives a request to close an infrastructure model via an infrastructure modeling frontend module (e.g., iModel.js Frontend module) 128 of a frontend applications 120, 122. In response, at step 310, the infrastructure modeling backend module 134 calls the infrastructure modeling native module (e.g., an iModel.js Native module) 136 to close the local briefcase 138. At step 315, the infrastructure modeling native module 136 closes the local briefcase 138, at step 320, returns a confirmation to the infrastructure modeling backend module 134. At step 325, the infrastructure modeling backend module 134, optionally, clears any related information of the briefcase from its local storage. Thereafter, at step 330, the infrastructure modeling backend module 134 returns a confirmation response via the infrastructure modeling frontend module 128 to the frontend application 120, 122.

Figure 4:
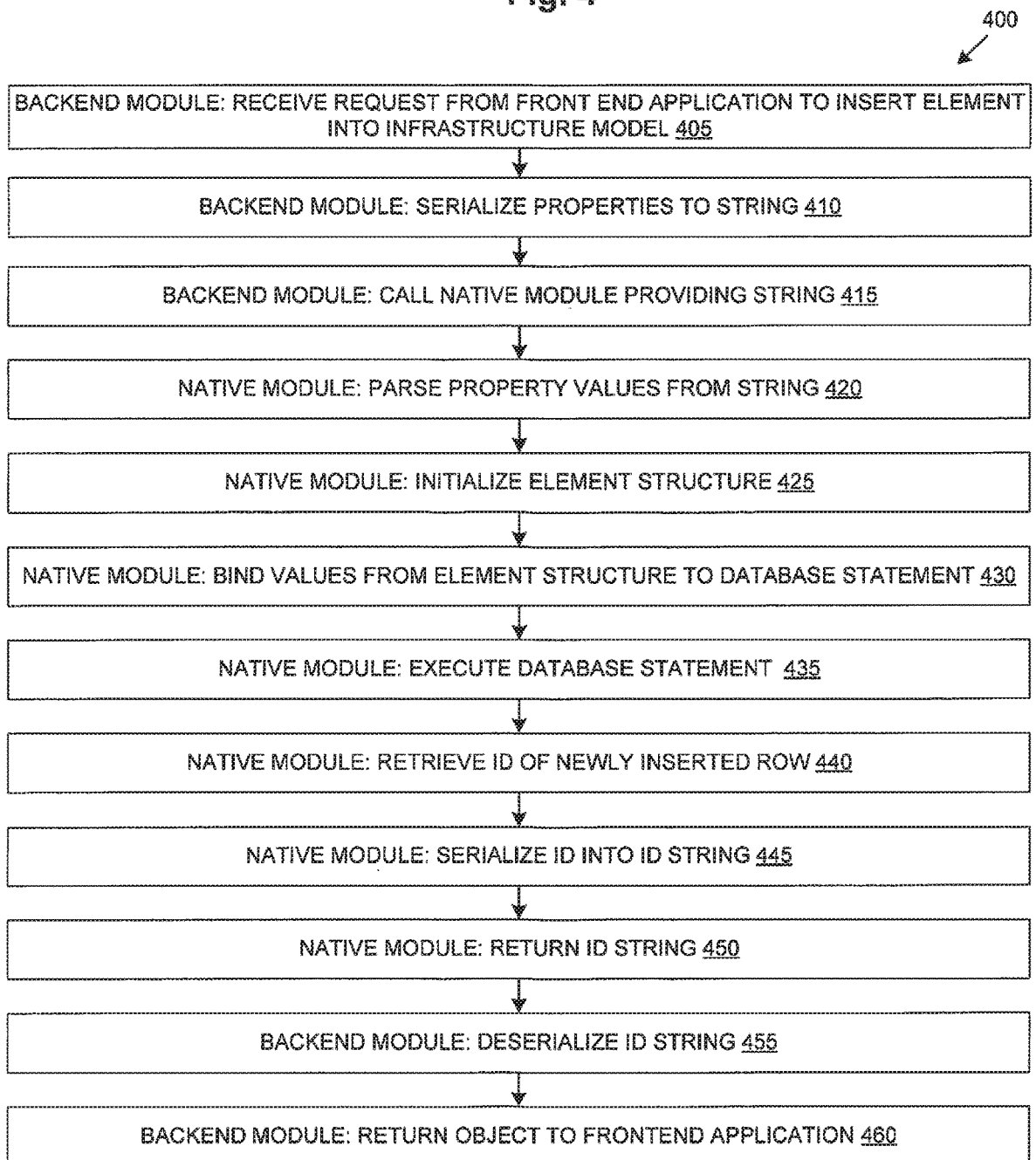
FIG. 4 is a flow diagram of an example sequence of steps for inserting an element into an infrastructure model.

FIG. 4 is a flow diagram of an example sequence of steps 400 for inserting an element into an infrastructure model. At step 405, the infrastructure modeling backend module (e.g., iModel.js Backend module) 134 of a backend application 130, 132 receives a request to insert a new element having one or more properties via an infrastructure modeling frontend module (e.g., iModel.js Frontend module) 128 of a frontend applications 120, 122. At step 410, the infrastructure modeling backend module 134 serializes the properties into a properties string (e.g., a JSON string). In response, at step 415, the infrastructure modeling backend module 134 calls the infrastructure modeling native module (e.g., an iModel.js Native module) 136 to insert the element, providing the properties string. In response to the call, at step 420, the infrastructure modeling native module 136 parses property values from the properties string, and, at step 425, initializes an element structure from the property values. At step 430, the infrastructure modeling native module 136 binds values from the element structure to a database statement (e.g., a SQL INSERT statement), and, at step 435, executes the database statement against the local briefcase 138. The statement may create a new row in the database for the inserted element, and such new row may be stored in a changeset. At step 440, the infrastructure modeling native module 136 retrieves an identifier (e.g., an ElementId) of the newly inserted row, and, at step 445, serializes the identifier in an identifier string (e.g., a JSON string). At step 450, it returns the identifier string to the infrastructure modeling backend module 134. At step 455, the infrastructure modeling backend module 134 deserializes the identifier string, and, at step 460, returns an object (e.g., a JavaScript object or another type of object) via the infrastructure modeling frontend module 128 to the frontend application 120, 122.

Figure 5:
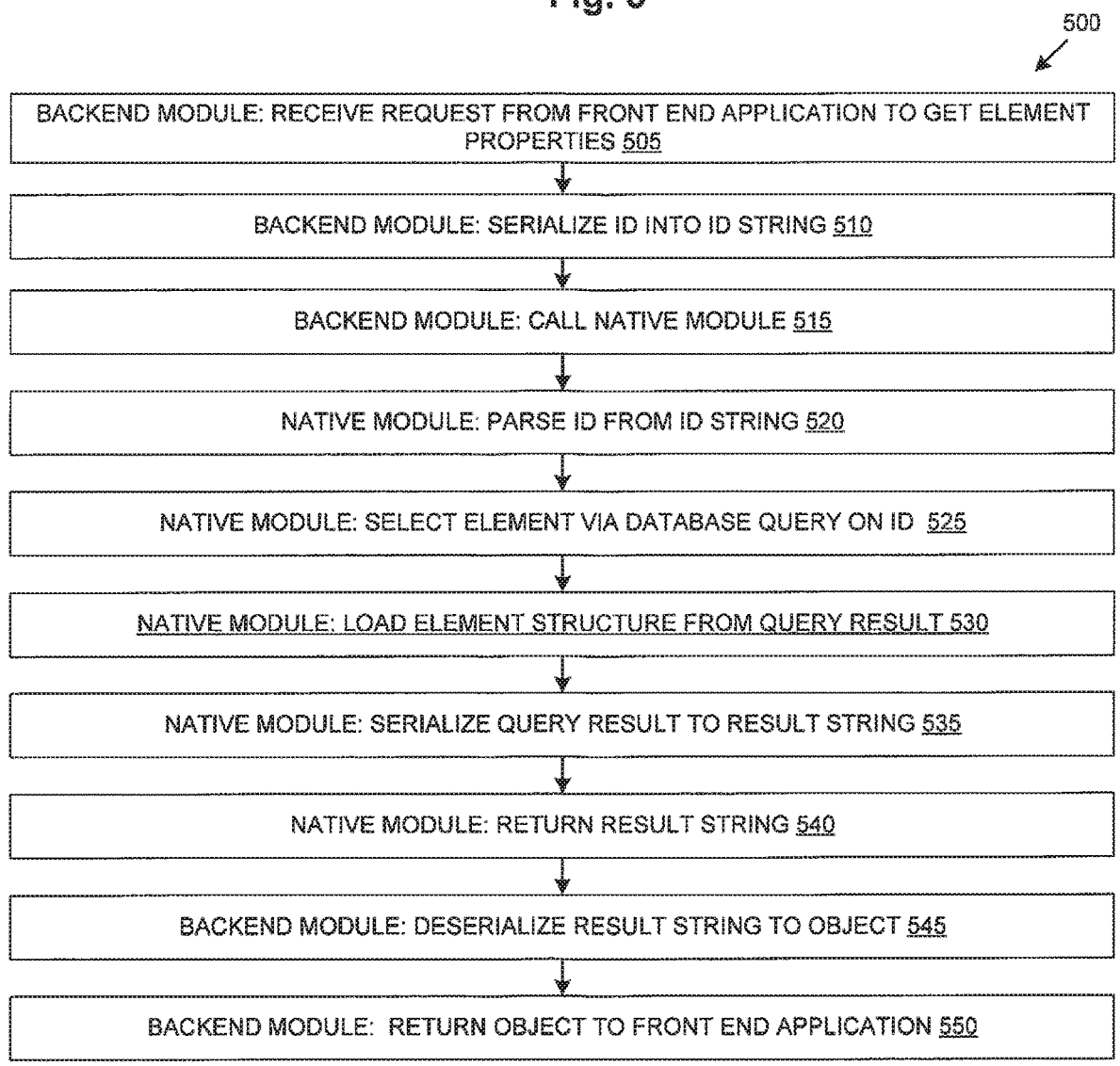
FIG. 5 is a flow diagram of an example sequence of steps for retrieving properties of an element from an infrastructure model.

FIG. 5 is a flow diagram of an example sequence of steps 500 for retrieving properties of an element from an infrastructure model. At step 505, the infrastructure modeling backend module (e.g., iModel.js Backend module) 134 of a backend application 130, 132 receives a request to get element properties of an element of the infrastructure model via an infrastructure modeling frontend module (e.g., iModel.js Frontend module) 128 of a frontend applications 120, 122. The request includes an identifier of the element. In response, at step 510, the infrastructure modeling backend module 134 serializes the identifier into an identifier string (e.g., a JSON string), and, at step 515, calls the infrastructure modeling native module (e.g., an iModel.js Native module) 136, providing the identifier string. In response to the call, at step 520, the infrastructure modeling native module 136 parses an identifier (e.g., an ElementId) from the identifier string, and, at step 525, performs a query on a briefcase 138 for the element that includes the identifier (e.g., an ElementId). At step 530, it loads an element structure from the query result, and, at step 535, serializes at least a portion thereof in a result string (e.g., a JSON string). At step 540, the infrastructure modeling native module 136 returns the result string to the infrastructure modeling backend module 134. At step 545, the infrastructure modeling backend module 134 deserializes the result string into an object (e.g., of a just-in-time defined JavaScript class or another type of class). At step 550, the infrastructure modeling backend module 134 returns the object via the infrastructure modeling frontend module 128 to the frontend application 120, 122.

FIG. 6 is a flow diagram of an example sequence of steps 600 for querying an infrastructure model. At step 605, the infrastructure modeling backend module (e.g., iModel.js Backend module) 134 of a backend application 130, 132 receives a request to query an infrastructure model via an infrastructure modeling frontend module (e.g., iModel.js Frontend module) 128 of a frontend applications 120, 122. The request includes a query statement and bindings. In response, at step 610, the infrastructure modeling backend module 134 calls the infrastructure modeling native module (e.g., an iModel.js Native module) 136, providing the query statement. In response to the call, at step 615, the infrastructure modeling native module 136 prepares a database statement (e.g., a SQL SELECT statement) against a local briefcase 138, and, at step 620, returns a status to the infrastructure modeling backend module 134. At step 625, the infrastructure modeling backend module 134 may abort on an error status or continue on a success status. At step 630, the infrastructure modeling backend module 134 calls the infrastructure modeling native module 136 providing the bindings. At step 635, the infrastructure modeling native module 136 binds values from the bindings into the database statement (e.g., a SQL SELECT statement), and, at step 640, returns a status to the infrastructure modeling backend module 134. At step 645, the infrastructure modeling backend module 134 may abort on an error status or continue on a success status. At step 650, the infrastructure modeling backend module 134 calls the infrastructure modeling native module 136 for results of the query. At step 655, the infrastructure modeling native module 136 executes the database statement on the local briefcase 138, and, at step 660, constructs an object (e.g., a JSON object) from the results that, at step 665, is returned to the infrastructure modeling backend module 134. At step 670, the infrastructure modeling backend module 134 returns the object via the infrastructure modeling frontend module 128 to the frontend application 120, 122.

In summary, decoupling user access to infrastructure models from proprietary software that maintains and updates the infrastructure models. It should be understood that a wide variety of adaptations and modifications may be made to the techniques. Further, in general, functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A system comprising:

one or more computing devices that include one or more processors and one or more memories coupled to the processors, the one or more memories configured to store software modules executable on the processors, including:

an infrastructure modeling backend module configured to
- obtain from an infrastructure modeling frontend module a request to open an infrastructure model,
- call infrastructure modeling hub services executing on the one or more cloud computing devices to obtain one or more changesets from a repository applicable to a local instance of a database that stores the infrastructure model,
- provide the one or more changesets to an infrastructure modeling native module,
- obtain a request to perform an operation on the infrastructure model, and
- call the infrastructure modeling native module to perform the operation; and the infrastructure modeling native module configured to
- in response to receipt of the one or more changesets from the infrastructure modeling backend module, apply the one or more changesets to the local instance of the database to update the local instance, and
- in response to receipt of the call to perform the operation, perform the operation on the local instance of the database, the operation to include at least one of inserting into, deleting from, or querying about models, elements, or properties, wherein the infrastructure modeling backend module is functionally separated from the infrastructure modeling native module and lacks ability itself to interact with the local instance of the database.

2. The system of claim 1, wherein the infrastructure modeling native module is further configured to return to the infrastructure modeling backend module, a response based on the performed operation, the response usable to update a display of the infrastructure model.

3. The system of claim 1, wherein the infrastructure modeling frontend module is part of an infrastructure modeling frontend application configured to execute on a client device.

4. The system of claim 1, wherein the infrastructure modeling frontend module is a part of a web frontend application that is configured to execute within a web browser on a client device.

5. The system of claim 1, wherein the infrastructure modeling frontend module is a part of a desktop frontend application on a client device that includes an embedded web browser, and the infrastructure modeling backend module is a part of a backend application on the client device.

6. The system of claim 1, wherein the operation is to insert an element into the infrastructure model.

7. The system of claim 1, wherein the operation is to retrieve properties of an element of the infrastructure model.

8. The system of claim 1, wherein the operation is to generate a database query against the instance of the database storing the infrastructure model.

* * * * *

UNITED STATES PATENT AND TRADEMARK OFFICE
CERTIFICATE OF CORRECTION

| | | |
|---|---|---|
| PATENT NO. | : 11,645,296 B1 | Page 1 of 1 |
| APPLICATION NO. | : 16/559057 | |
| DATED | : May 9, 2023 | |
| INVENTOR(S) | : Keith A. Bentley et al. | |

It is certified that error appears in the above-identified patent and that said Letters Patent is hereby corrected as shown below:

In the Specification

Column 1, Line 29:
"descriptions for is different phases of the project. In the past,"
Should read:
--descriptions for different phases of the project. In the past,--

Signed and Sealed this
Twenty-fifth Day of March, 2025

Coke Morgan Stewart
*Acting Director of the United States Patent and Trademark Office*